United States Patent
Da Rocha Mordente et al.

(10) Patent No.: US 9,181,870 B2
(45) Date of Patent: Nov. 10, 2015

(54) ELEMENT PROVIDED WITH AT LEAST ONE SLIDE SURFACE FOR USE ON AN INTERNAL COMBUSTION ENGINE

(75) Inventors: Paulo Jose Da Rocha Mordente, Jundiai (BR); Robert R. Banfield, Sao Paulo (BR); Juliano A. Araujo, Jundiai (BR); Jose V. Sarabanda, Sao Paulo (BR)

(73) Assignees: MAHLE METAL LEVE S/A (BR); MAHLE INTERNATIONAL GMBH (DE)

( * ) Notice: Subject to any disclaimer, the term of this patent is extended or adjusted under 35 U.S.C. 154(b) by 0 days.

(21) Appl. No.: 14/122,995

(22) PCT Filed: May 28, 2012

(86) PCT No.: PCT/BR2012/000161
§ 371 (c)(1),
(2), (4) Date: May 8, 2014

(87) PCT Pub. No.: WO2012/162772
PCT Pub. Date: Dec. 6, 2012

(65) Prior Publication Data
US 2014/0245987 A1    Sep. 4, 2014

(30) Foreign Application Priority Data
May 27, 2011    (BR) ...................... 1102336

(51) Int. Cl.
*F02B 77/00*    (2006.01)
*C23C 14/06*    (2006.01)
(Continued)

(52) U.S. Cl.
CPC ............. *F02B 77/00* (2013.01); *C23C 14/0641* (2013.01); *C23C 14/3485* (2013.01);
(Continued)

(58) Field of Classification Search
CPC ......... F02B 77/00; C23C 14/34; C23C 14/06; C23C 14/0641; C23C 14/3485; C23C 28/322; C23C 28/34; C23C 28/347; C23C 30/00; Y10T 29/49229
USPC ....... 123/198 R; 508/100–109; 277/442, 443, 277/444; 428/698
See application file for complete search history.

(56) References Cited

U.S. PATENT DOCUMENTS 4,517,726 A * 5/1985 Yokoshima et al. ......... 29/527.4
4,989,556 A * 2/1991 Shiina et al. ............... 123/90.67
(Continued)

FOREIGN PATENT DOCUMENTS

JP         02049956 A  *  2/1990  ................ F02F 1/00

OTHER PUBLICATIONS

Sarakinos et al., High Power Pulse Magnetron Sputtering: A Review on Scientific and Engineering State of the Art, Surface Coatings and Technology 204, 1661-1684 (2010).*
(Continued)

*Primary Examiner* — Lindsay Low
*Assistant Examiner* — Grant Moubry
(74) *Attorney, Agent, or Firm* — Fishman Stewart Yamaguchi PLLC

(57) ABSTRACT

The present invention relates to an element (1) that works sliding, of an internal combustion engine and/or a compressor that undergoes friction and receives a coating of chrome nitride having an equiaxial morphology, with low porosity (lower than 1%) and with a crystallographic orientation predominantly (111), maintaining some reticulate in the orientation (200), so as to improve its resistance to wear and its toughness, prolonging the useful life of the element (1) that works sliding.

19 Claims, 3 Drawing Sheets

(51) Int. Cl.
    C23C 14/34    (2006.01)
    C23C 30/00    (2006.01)
    C23C 28/00    (2006.01)
(52) U.S. Cl.
    CPC ............ *C23C28/322* (2013.01); *C23C 28/34* (2013.01); *C23C 28/347* (2013.01); *C23C 30/00* (2013.01); *Y10T 29/49229* (2015.01)

(56) References Cited

U.S. PATENT DOCUMENTS

| | | | |
|---|---|---|---|
| 5,743,536 A | | 4/1998 | Komuro et al. |
| 5,851,659 A | | 12/1998 | Komuro et al. |
| 6,149,162 A | * | 11/2000 | Tanaka et al. ............ 277/443 |
| 6,232,003 B1 | * | 5/2001 | Ogawa et al. ............ 428/698 |
| 6,235,415 B1 | * | 5/2001 | Ogawa et al. ............ 428/698 |
| 6,283,478 B1 | * | 9/2001 | Kumai et al. ............ 277/435 |
| 6,372,369 B1 | | 4/2002 | Ito et al. |
| 6,494,461 B1 | * | 12/2002 | Ogawa et al. ............ 277/442 |
| 8,575,076 B2 | * | 11/2013 | Hamada et al. ............ 508/109 |
| 2008/0007006 A1 | * | 1/2008 | Kawai ............ 277/310 |
| 2008/0076683 A1 | * | 3/2008 | Okamoto et al. ............ 508/103 |
| 2009/0278320 A1 | | 11/2009 | Araujo et al. |

OTHER PUBLICATIONS

Hovsepian, P EH et al: "CrAlYCN/CrCN nanoscale multilayer PVD coatings deposited by the combined High Power Impulse Magnetron Sputtering/Unbalanced Magnetron Sputtering (HIPIMS/UBM) technology", Surface & Coatings Technology, Elsevier, Amsterdam, NL, vol. 203, No. 9, Jan. 25, 2009, pp. 1237-1243.

Purandare, Y et al: "Deposition of nanoscale multilayer CrN/NbN physical vapor deposition coatings by high power impulse magnetron sputtering", Journal of Vacuum Science and Technology: Part A, AVS/AIP, Melville, NY., US, vol. 26, No. 2, Feb. 20, 2008, pp. 288-296.

Safran, G. et al.: "Influence of the bias voltage on the structure and mechanical performance of nanoscale multilayer CrAlYN/CrN physical vapor deposition coatings", Journal of Vacuum Science and Technology: Part A, AVS/AIP, Melville, NY, US, vol. 27, No. 2; Feb. 6, 2009, pp. 174-182.

Ehiasarian, A.P. et al.: "Comparison of microstructure and mechanical properties of chromium nitride-based coatings deposited by high power impulse magnetron sputtering and by the combined steered cathodic arc/unbalanced magnetron technique", Thin Solid Films, Elsevier-Sequoia S.A., Lausanne, CH, vol. 457, No. 2, Jun. 15, 2004, pp. 270-277.

Hovsepian, P. EH. et al.: "CrAlYN/CrN superlattice coatings deposited by the combined high power impulse magnetron sputtering/unbalanced magnetron sputtering technique", Surface & Coatings Technology, Elsevier, Amsterdam, NL, vol. 201, No. 7, Dec. 20, 2006, pp. 4105-4110.

Lin, J. et al.: "High rate deposition of thick CrN and $Cr_2N$ coatings using modulated pulse power (MPP) magnetron sputtering", Surface & Coatings Technology, Elsevier, Amsterdam, NL, vol. 205, No. 10, Feb. 15, 2011, pp. 3226-3234.

* cited by examiner

ELEMENT PROVIDED WITH AT LEAST ONE SLIDE SURFACE FOR USE ON AN INTERNAL COMBUSTION ENGINE

CROSS-REFERENCE TO RELATED APPLICATIONS

This application is a US national phase application of PCT/BR2012/000161, filed on May 28, 2012, which claims priority to Brazilian patent application PI1102336-8, filed on May 27, 2011, the contents of which are hereby incorporated by reference in their entirety.

TECHNICAL FIELD

The present invention relates to an element that works sliding on an internal combustion engine and that receives a chrome-based coating so as to improve its resistance to wear, increasing the useful life of the assembly.

BACKGROUND

Internal combustion engine comprise numberless elements that undergo friction and, as a result, undergo wear because they are subjected to severe stresses when the engine is functioning.

One of the ways to guarantee resistance to wear for an element that works sliding so that it can have long/sufficient useful life for the useful-life parameters of the engine is the application of one or more layers of coating on the base metal from which it is built. The coating, developed specifically for resisting wear and abrasion, maintains the performance properties of the element that works sliding, even after millions of explosion cycles of the engine.

Besides cylinders, pistons and rings, an internal combustion engine has a number of additional elements provided with at least one slide surface, which can receive coatings so as to prolong the useful life of the piece. Some of these elements are bronze bushings, cylinder bushings, components of the valve gear, etc.

In this regard, there are numberless techniques using the most varied compositions of coatings and numberless application processes, each trying to optimize the performance and durability properties of the most varied types and configurations of elements for use on an internal combustion engine having a slide surface.

In the spirit of the elements that work sliding and are object of the present invention, films/coatings of chrome nitride (CrN,Cr2N) used, for example, for piston rings applied to internal combustion engine, have typically "columnar" morphology (see FIG. 1) with the orthogonal direction to the substrate or metallic base that will receive the coating.

It should be noted that, since this is a coating applied to a surface that has relative sliding movement, for instance, reciprocating, a stress tangent to the free surface is intrinsic to the coating material because of the friction. In this condition, the stress of the coating due to friction takes place in the direction of less resistance of the coating because of its "columnar" texture.

Another condition that also affects the resistance of the films is the presence of pores (not shown in the figures). Pores are regions present in the coating, which have defect due to the extremely low localized cohesion of the material. Thus, the pores act as tension concentrators in greater or lesser scale, depending on the geometry and number of pores.

Thus, the orientation of the structure of the coating material influences its performance directly. Typically, cross-linking agents with (111) or (200) orientations are produced. The first orientation of the material (111) is known for exhibiting good resistance to wear, while the second orientation (200) contributes to minimizing internal tensions of the coating and, as a result, enables one to obtain a coating with more thickness than that obtained with coatings that nave only the orientation (111).

There are a few prior-art elements that work sliding and exhibit columnar morphology and orientation (111). Examples thereof are shown in documents U.S. Pat. No. 5,743,536 and U.S. Pat. No. 5,851,659, which describe piston rings provided with chrome-nitride coatings with columnar morphology and orientation (111) parallel to the coating surface. These documents disclose a coating having thickness that ranges from 1 to 80 micrometers (μm), with hardness ranging from 600 to 1000 Vickers (HV) and porosity ranging from 1.5 to 20%.

Additionally, there are also prior-art documents that present columnar morphology and both orientations (111) and (200). North-American document US 2009/278320A1 discloses a chrome-nitride coating with columnar morphology, provided with both orientations with a view to achieve benefits, mainly with regard to toughness. However, this prior-art document exploits a relatively small range of the (111)/(200) ratio, which ranges from 0.8 to 1.2. In other words, both orientations remain in an almost similar relationship, providing a film with thickness higher than 80 μm, hardness ranging from 1500 to 2500 HV and porosity higher than 10%.

Finally, document U.S. Pat. No. 6,372,369 describes an element that works sliding for use on an internal combustion engine (piston ring), which element is provided with a chrome-nitride coating (CrN) and titanium nitride (TiN) containing oxygen and that also exhibits a columnar morphology. This coating has a thickness ranging from 1 to 100 μm and hardness ranging from 1300 to 2300 HV. Such characteristics are achieved through an orientation of the coating with predominance of orientations (111) or (200). Thus, the chrome-nitride and titanium-nitride crystals have a preferred orientation (200) or (111) parallel to the surface to be coated, its morphology being thus columnar, from the base material to the outer surface of the coating.

In spite of the technological advances evidenced by the prior-art documents, one has not yet found a solution that could enable coatings of elements that work sliding applied to internal combustion engines with an increase of their resistance to wear, while preserving toughness and guaranteeing porosity lower than 1% or virtually zero.

Additionally, besides the fact that the prior art does not achieve coatings that provide extreme resistance to wear for sliding elements, enabling them to perform their functions adequately during long functioning cycles, such documents do not disclose the possibility of using coatings with alternative morphologies. Such morphologies are more capable of resisting the tribological conditions to which the sliding elements are subject, providing more durable conditions of functioning and enabling the internal combustion engines exhibit greater efficiency and lower emission of polluting gases.

Thus, the solutions of the prior art have two great drawbacks, which have not been eliminated so far. On the other hand, the increase in resistance to wear impairs the toughness of the coating and, on the other hand, the coatings exhibit porosity that is harmful to the durability of the coating. In this regard, the variables: resistance to wear, toughness and porosity are limited to an equation that needs the introduction of a new paradigm in order to achieve better results, namely at the level of the morphology of chrome-nitride coatings and the orientation of their structure.

SUMMARY

The present invention has the objective of providing an element that works sliding for use on an internal combustion engine with a chrome-nitride coating capable of guaranteeing an increase in the resistance to wear, while preserving the toughness values.

The present invention also has the objective or providing an element that works sliding with a chrome-nitride coating having equiaxial morphology with a predominantly atomic orientation (111), also having retention in the structure of the orientation (200).

The present invention further has the objective of providing an element that works sliding with a chrome-nitride coating virtually free of porosity.

The objectives of the present invention are achieved by means of an element provided with at least one sliding surface for use on an internal combustion engine, the element comprising a base of a given metallic alloy and an outer surface provided with a chrome-nitride hard coating, generated by physical deposition on the vapour phase, the coating having porosity in a range lower than 1% by volume and being provided with an equiaxial crystalline structure.

BRIEF DESCRIPTION OF THE DRAWINGS

The present invention will now be described in greater detail with reference to the example of embodiment represented in the drawings. The figures show.

DETAILED DESCRIPTION

The present invention relates to elements provided with at least one sliding surface for use on internal combustion engines. One should note that the elements (1) that work sliding may comprise various components of an engine that undergo contact, wherein friction results between them. Thus, the coating (4) of the present invention can be applied to one of two elements or simultaneously to both elements that will interact mutually.

Figure 5:
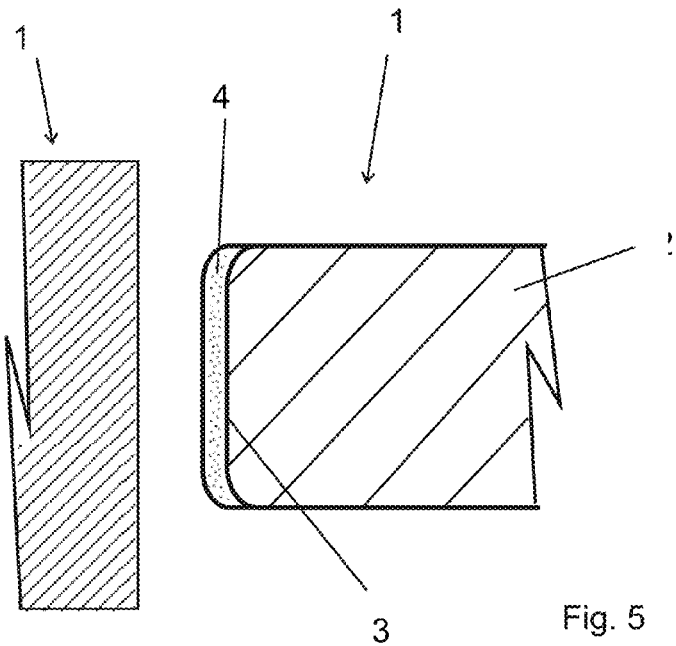
FIG. 5 is a view of two elements that work sliding, one of which is provided with a chrome-nitride coating with equiaxial morphology according to the present invention.
Figure 6:
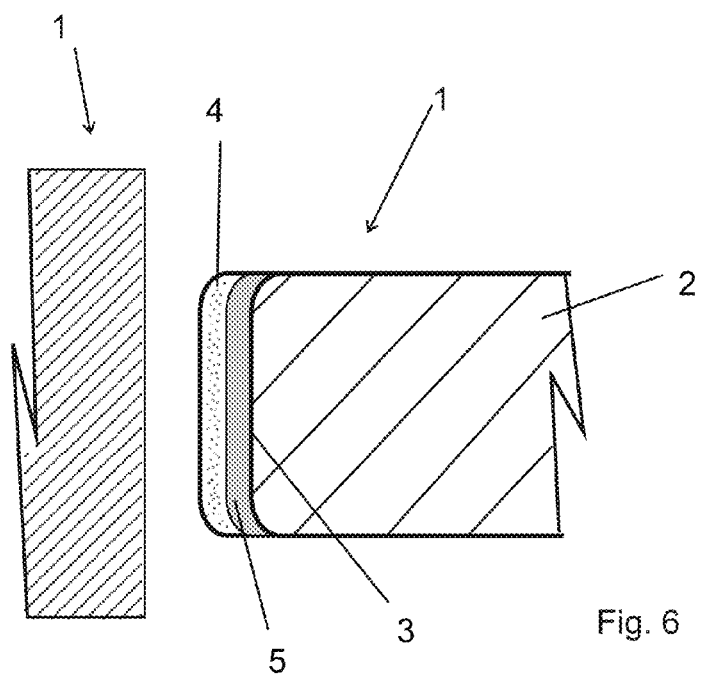
FIG. 6 is a view of two elements that work sliding, one of which is provided with an intermediate layer for connection between the chrome-nitride coating of the present invention and the base.

The element 1 that works sliding according to the present invention comprises a base 2 of a metallic alloy and an outer surface 3 that will receive the coating 4 (see FIGS. 5 and 6).

The base 2 may be constituted by a ferrous alloy or steel, as for example a steel containing from 10 to 17% chrome (stainless steel).

Examples of elements 1 that work sliding according to the present invention are found in piston rings, of both compression and oil, bearings, cylinders and cylinder sleeves, pistons, and rings, among numberless others.

Figure 3:
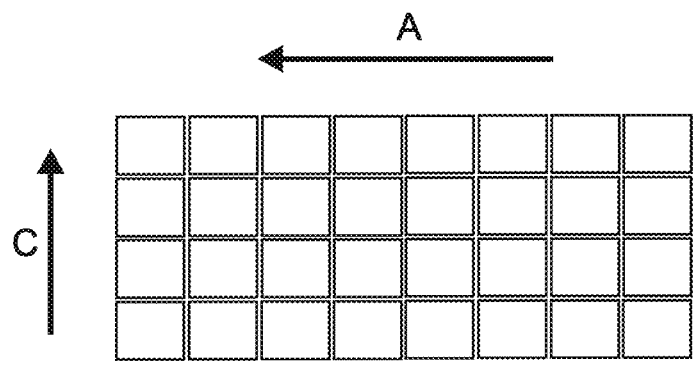
FIG. 3 is an illustration of a coating with columnar morphology exhibiting the direction of growth and of stress resulting from friction.

As said before, coatings of chrome nitride according to the prior art applied to elements 1 that work sliding for use on an internal combustion engines are characterized by a columnar morphology. Coatings with columnar morphologies exhibit anisotropic resistance of the material. This type of coating of columnar morphology, as already seen, does not provide the best results of resistance to wear, because the mechanical stress of the coating resulting from friction "A" takes place in the direction of lower resistance of the coating because of its "columnar" texture (see FIG. 3), that is, tangentially to a direction of the orthogonal growth "C" toward the base to be coated.

The coating 4 of the present invention is based on a morphology other than that of the prior art, promoting the growth of a coating 4 with equiaxial morphology (see FIG. 4), which results in a coating 4 provided with isotropic properties. From an observation of the two figures, it becomes evident that the morphology of the present invention can bear the loads resulting from friction (A) more easily, by virtue of the fact that it does not have a linearly stacked structure (columnar). In the equiaxial structure there is disalignment from the center of the "blocks" in an equiaxial manner, causing the load exerted by a "block" to be distributed downward in two "blocks", thus resulting in greater capability of resisting stresses.

Figure 1:
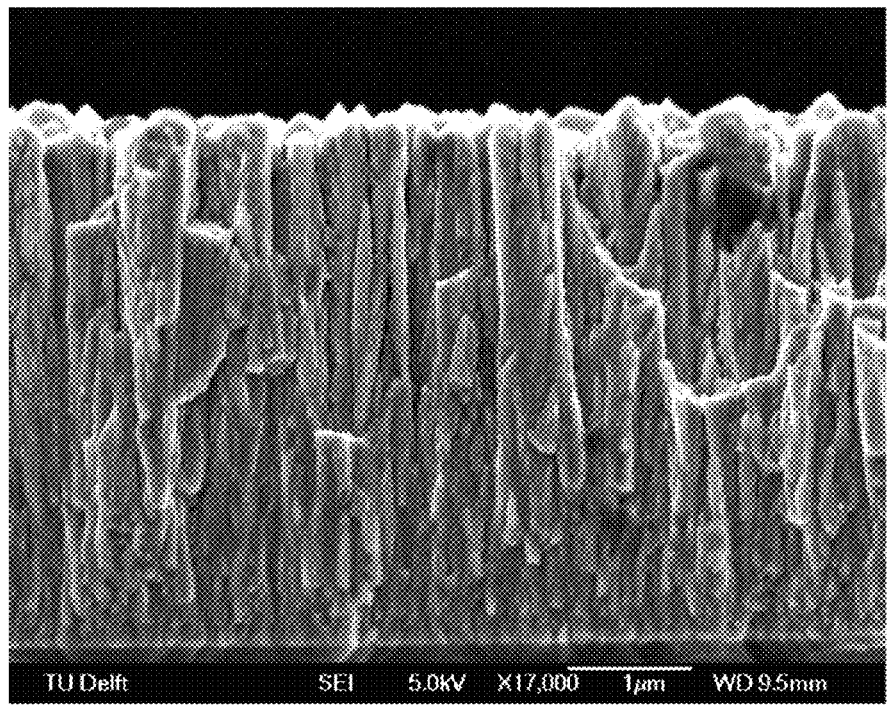
FIG. 1 is a photograph of the columnar morphology of a chrome-nitride coating of an element that works sliding according to the prior art.
Figure 2:
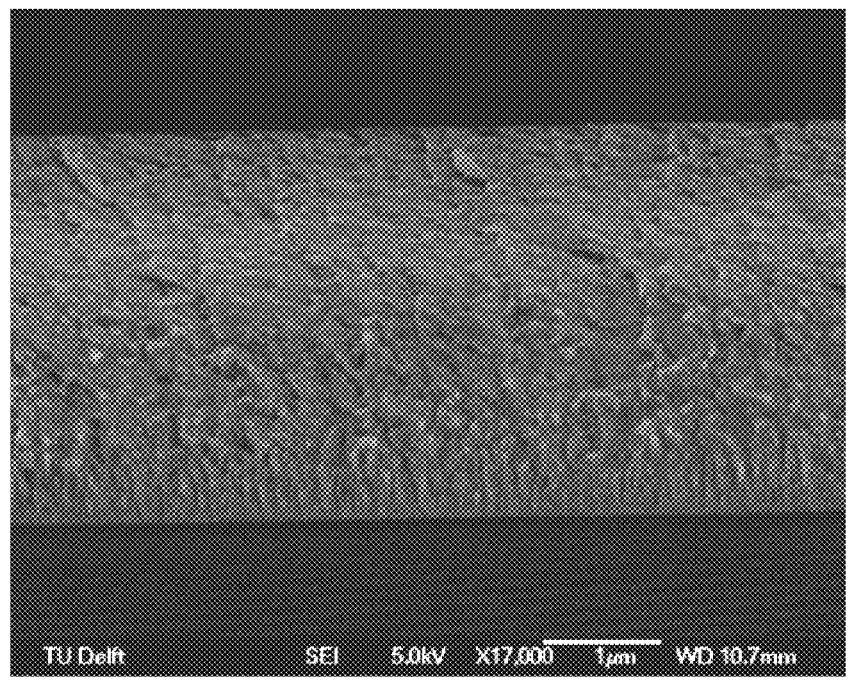
FIG. 2 is a photograph of the equiaxial morphology of a chrome-nitride coating of an element that works sliding according to the present invention.

One example of this type of morphology is shown by photos of the FIGS. 1 and 2. The columnar morphology (FIG. 1) is more defined, it being evident that these are overlapping columns. In turn, the equiaxial morphology (FIG. 2) is less linear as explained above.

However, it was not only the morphology of the coating 4 that enabled the excellent results achieved by the coating 4 of the present invention. The coating 4 of the present invention achieved much lower porosity values than those found in the prior art for chrome-nitride coatings. Thus, the maximum porosity found does not exceed 1% by volume of coating 4, with a tendency to absence of porosity, that is, virtually zero porosity.

In addition to the benefits provided by the equiaxial morphology of the coating 4 proposes by the present invention, it is fundamental to notice that the absence of porosity (or its tendency to zero) is a great benefit for the mechanical properties of the coating 4. As it is known, porosity impairs the structural resistance of a coating because it acts simultaneously as a defeat and as a tension concentrator. Thus, the decrease in the amounts and duration of such discontinuities provide more dense coatings 4, provided with greater resistance to wear and greater toughness.

Further with reference to the improvements introduced in the coating of the present invention, it should be noted that there was a considerable improvement of the mechanical properties resulting from a new arrangement in the atomic orientation of the chrome-nitride coating.

Many of the prior-art documents describe family orientation (111) as being intrinsically provided with good resistance to wear. Such finding is due, in part, to the fact that this crystallographic orientation approaches the centered face cubic (CFC) structure, that is, provided with a smaller atomic spacing, which reflects in an improvement of the wear on think coatings. However, the high inner stress inherent in the growth of a coating obviously limits its growth (larger thickness), upon a direction (111).

On the other hand, crystallographic orientations of the family (200) cause high difficulty in moving dislocations with a view to alleviate the external shearing stresses applied to the coating surface, which causes displacement of the crystalline planes with orientation (200), which is highly undesirable in a coating of an element 1 that works sliding.

Thus, according to the understandings of the coating 4 of the present invention, crystalline planes of the family (111) improve the resistance the appearance of cracks, and small amounts of the family (200) improve the resistance to propagation of cracks. The present invention applies both crystalline orientations as a metallurgical mechanism capable of preventing the displacement of the coating and improving the resistance to wear by reducing the energy of interface between the planes.

With a view to achieve the mentioned benefits effectively, said coating 4 of the present invention implements a distribution of the crystalline planes predominantly (111). Quantifying this value, the crystallographic distribution according to orientations of the family (111) is about one and a half time to a hundred times higher than that of crystalline planes of family (200), that is, (111)/(200)=1.5 to 100.

Thus, what was a limitation to the growth of coatings before, limiting them in determined circumstances to 1 μm or 2 μm, is now a solved problem. The solution proposed by the present invention enables one to increase the thickness of the coatings with the advantage of maintaining the same toughness values.

Finally, in order to achieve the properties of the coating 4 of a sliding element 1 for use on an internal combustion engine, one has used a process for deposition of chrome nitride as generated by the physical vapour deposition, more concretely through high pulsing power by high power impulse magnetron sputtering—HPIMS.

Figure 4:
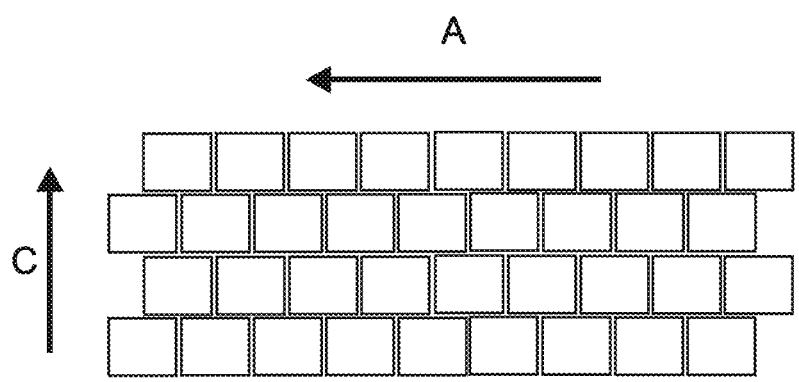
FIG. 4 is an illustration of a coating with equiaxial morphology exhibiting the direction of growth and of stress resulting from friction.

This deposition process makes use of a phenomenon that consists in increasing substantially the energy (higher velocity) with which the ions reach the metallic base 1 on which the growth of the coating 4 takes place, with a considerable modification in the structure of the coating 4, thus passing from a typically columnar morphology (see FIGS. 1 and 3) to an equiaxial morphology (see FIGS. 2 and 4). Consequently, such phenomenon has the capability of producing a denser and denser film as a function of the energy of the ions that form the coating.

As a function of the characteristics of the deposition process, one observes a more and more preferred formation of the orientation of the cross-linking with greater amount (111), but retaining a structure with (200) orientation, thus imparting toughness to the coating 4.

A preferred embodiment of the present invention may be understood through FIGS. 5 and 6. Supposing that the figures deal with a piston ring and a cylinder of an internal combustion engine (both elements that work sliding 1), one can coat only one or both elements 1 that work sliding. In the concrete case, we will dwell on a classic example in which a piston ring for arrangement in any of its grooves, receiving the coating 4 of the present invention on the surface that will contact the cylinder wall.

Thus, a metallic base 2 of the piston ring receives, on its outer surface 3, a chrome-nitride coating 4 deposited by the HIPIMS process. Laboratory results demonstrate that the coating 4 is provided with equiaxial morphology with extremely low occurrence (lower than 1%) of porosity or no porosity at all. Together with this, the structure of the reticulate in a direction parallel to the preferred base 2 of (111) enables one to observe a film of extreme resistance to wear (higher than that of the prior art), but exhibiting the toughness required (residual value of the orientation (200)) for developing adequately the protection function on the working surface of the piston ring.

It should be noted that the values measured have demonstrated that the ratio between the crystallographic orientations (111) and (200) is between one and a half time and a hundred times. In turn, the hardness values range from 1500 HV and 2500 HV, the coating 4 has achieved thickness ranging from 5 μm and 60 μm.

Thus, it is clear that the coating 4 of the present invention, besides proposing a new equiaxial morphology on elements that work sliding 1 for use on an internal combustion engine, bring numberless characteristics capable of overcoming the difficulties encountered in prior-art coatings, imparting longer durability.

A preferred example of embodiment having been described, one should understand that the scope of the present invention embraces other possible variations, being limited only by the accompanying claims, which include the possible equivalents.

The invention claimed is:

1. An element provided with at least one sliding surface for use on an internal combustion engine, the element comprising: a base of a metallic alloy and an outer surface having a hard coating of chrome nitride disposed thereon via physical vapour deposition, wherein the coating includes a porosity with a rate lower than 1% by volume, a crystalline orientation predominately defined by planes (111) parallel to the outer surface of the base and an equiaxial crystalline structure, the equiaxial crystalline structure defined by a center point of respective crystalline structures being in equiaxial disalignment along a direction extending orthogonal to the outer surface of the base.

2. The element according to claim 1, wherein the crystalline orientation of the coating is further defined by a ratio of the planes parallel to the outer surface of the base, wherein the ratio of the crystalline planes (111) to crystalline planes (200) range from 1.5 to 100.

3. The element according to claim 2, wherein the coating includes a hardness ranging from 1500 HV to 2500 HV.

4. The element according to claim 1, where the coating includes a hardness ranging from 1500 HV to 2500 HV.

5. The element according to claim 1, wherein the coating includes a thickness ranging from 5 to 60 μm.

6. The element according to claim 1, wherein the base includes cast iron.

7. The element according to claim 1, wherein the base includes steel.

8. The element according to claim 7, wherein the base further includes an amount of chrome ranging from 10 to 17 percent by weight.

9. The element according to claim 1, wherein the coating contains an element selected from the group of oxygen and carbon in an amount greater than 5 percent.

10. The element according to claim 1, further comprising an intermediate layer for connection between the coating and the base.

11. The element according to claim 10, wherein the intermediate layer includes at least one of chrome, nickel, and cobalt.

12. The element according to claim 1, wherein the physical deposition in the vapor phase is achieved by high pulsing power by high power impulse magnetron sputtering.

13. A sliding member for an internal combustion member, comprising:
 a base material; and
 a coating comprising a chrome nitride, the coating having a porosity with a rate lower than 1 percent by volume and has an equiaxial crystalline structure;
 wherein the coating includes a crystalline orientation defined by a ratio of the planes parallel to a surface of the coating, wherein the ratio between crystalline planes (111) and (200) range from 1.5 to 100.

14. The sliding member according to claim 13, wherein the coating has a hardness ranging from 1500 HV to 2500 HV.

15. The sliding member according to claim 13, wherein the coating has a thickness ranging from 5 to 60 μm.

16. The sliding member according to claim 13, wherein the coating includes an element selected from the group of oxygen and carbon in an amount greater than 5 percent.

17. The sliding member according to claim 13, further comprising an intermediate layer for connection between the coating and the base material, the intermediate layer including at least one of chrome, nickel and cobalt.

18. The sliding member according to claim 13, wherein the equiaxial crystalline structure is defined by a center point of respective crystalline structures being in equiaxial disalignment along a direction extending orthogonal to the outer surface of the base.

19. A method for manufacturing an element with at least one sliding surface, comprising:
 providing a base of a metallic alloy; and
 generating a coating of chrome nitride on the base via physical vapor deposition, where the physical deposition in the vapor phase is achieved by high pulsing power by high power impulse magnetron sputtering;
 wherein the coating includes a porosity with a rate lower than 1 percent by volume and has an equiaxial crystalline structure, the equiaxial crystalline structure defined by a center point of respective crystalline structures being in disalignment along a direction extending orthogonal to a surface of the coating;
 wherein the coating includes a crystalline orientation defined by a ratio of the planes parallel to the surface of the coating-stf-aee, wherein the ratio between crystalline planes (111) and (200) range from 1.5 to 100.

* * * * *